(12) United States Patent
Kim et al.

(10) Patent No.: US 8,158,964 B2
(45) Date of Patent: Apr. 17, 2012

(54) SCHOTTKY DIODE SWITCH AND MEMORY UNITS CONTAINING THE SAME

(75) Inventors: Young Pil Kim, Eden Prairie, MN (US); Nurul Amin, Woodbury, MN (US); Dadi Setiadi, Edina, MN (US); Venugopalan Vaithyanathan, Bloomington, MN (US); Wei Tian, Bloomington, MN (US); Insik Jin, Eagan, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 298 days.

(21) Appl. No.: 12/502,221

(22) Filed: Jul. 13, 2009

(65) Prior Publication Data

US 2011/0006276 A1    Jan. 13, 2011

(51) Int. Cl.
*H01L 29/02* (2006.01)
*H01L 29/47* (2006.01)
(52) U.S. Cl. .................. 257/2; 257/471; 257/E29.336; 257/E45.002
(58) Field of Classification Search .............. 257/2, 471, 257/E29.336, E45.002
See application file for complete search history.

(56) References Cited

U.S. PATENT DOCUMENTS

| | | | |
|---|---|---|---|
| 3,746,945 A * | 7/1973 | Normington | ................. 257/476 |
| 3,982,233 A | 9/1976 | Crookshanks | |
| 3,982,235 A | 9/1976 | Bennett | |
| 4,056,642 A | 11/1977 | Saxena | |
| 4,110,488 A | 8/1978 | Risko | |
| 4,160,988 A | 7/1979 | Russell | |
| 4,232,057 A | 11/1980 | Ray | |
| 4,247,915 A | 1/1981 | Bartlett | |
| 4,323,589 A | 4/1982 | Ray | |
| 4,576,829 A | 3/1986 | Kaganowicz | |
| 4,888,304 A | 12/1989 | Nakagawa | |
| 4,901,132 A | 2/1990 | Kuwano | |
| 5,083,190 A | 1/1992 | Pfiester | |

(Continued)

FOREIGN PATENT DOCUMENTS

DE    102008026432    12/2009

(Continued)

OTHER PUBLICATIONS

Adee, S., "Quantum Tunneling Creates Fast Lane for Wireless", IEEE Spectrum, Oct. 2007.

(Continued)

*Primary Examiner* — Lex Malsawma
(74) *Attorney, Agent, or Firm* — Mueting Raasch & Gebhardt PA

(57) ABSTRACT

A switching element that includes a first semiconductor layer, the first semiconductor layer having a first portion and a second portion; a second semiconductor layer, the second semiconductor layer having a first portion and a second portion; an insulating layer disposed between the first semiconductor layer and the second semiconductor layer; a first metal contact in contact with the first portion of the first semiconductor layer forming a first junction and in contact with the first portion of the second semiconductor layer forming a second junction; a second metal contact in contact with the second portion of the first semiconductor layer forming a third junction and in contact with the second portion of the second semiconductor layer forming a fourth junction, wherein the first junction and the fourth junction are Schottky contacts, and the second junction and the third junction are ohmic contacts.

13 Claims, 8 Drawing Sheets

U.S. PATENT DOCUMENTS

| | | | |
|---|---|---|---|
| 5,135,878 A | 8/1992 | Bartur | |
| 5,278,636 A | 1/1994 | Williams | |
| 5,330,935 A | 7/1994 | Dobuzinsky | |
| 5,341,114 A * | 8/1994 | Calviello et al. | 333/17.2 |
| 5,365,083 A | 11/1994 | Tada | |
| 5,412,246 A | 5/1995 | Dobuzinsky | |
| 5,443,863 A | 8/1995 | Neely | |
| 5,580,804 A | 12/1996 | Joh | |
| 5,614,430 A | 3/1997 | Liang | |
| 5,739,564 A | 4/1998 | Kosa | |
| 5,872,052 A | 2/1999 | Iyer | |
| 5,913,149 A | 6/1999 | Thakur | |
| 5,923,948 A | 7/1999 | Cathey, Jr. | |
| 5,926,412 A | 7/1999 | Evans | |
| 5,929,477 A | 7/1999 | McAllister | |
| 6,011,281 A | 1/2000 | Nanokawa | |
| 6,013,548 A | 1/2000 | Burns | |
| 6,034,389 A | 3/2000 | Burns | |
| 6,077,745 A | 6/2000 | Burns | |
| 6,100,166 A | 8/2000 | Sakaguchi | |
| 6,114,211 A | 9/2000 | Fulford | |
| 6,121,642 A | 9/2000 | Newns | |
| 6,121,654 A | 9/2000 | Likharev | |
| 6,165,834 A | 12/2000 | Agarwal | |
| 6,300,205 B1 | 10/2001 | Fulford | |
| 6,341,085 B1 | 1/2002 | Yamagami | |
| 6,346,477 B1 | 2/2002 | Kaloyeros | |
| 6,376,332 B1 | 4/2002 | Yankagita | |
| 6,448,840 B2 | 9/2002 | Kao | |
| 6,492,244 B1 | 12/2002 | Christensen | |
| 6,534,382 B1 | 3/2003 | Sakaguchi | |
| 6,617,642 B1 | 9/2003 | Georgesca | |
| 6,624,463 B2 | 9/2003 | Kim | |
| 6,627,967 B2 * | 9/2003 | Asano et al. | 257/472 |
| 6,653,704 B1 | 11/2003 | Gurney | |
| 6,667,900 B2 | 12/2003 | Lowrey | |
| 6,750,540 B2 | 6/2004 | Kim | |
| 6,753,561 B1 | 6/2004 | Rinerson | |
| 6,757,842 B2 | 6/2004 | Harari | |
| 6,781,176 B2 | 8/2004 | Ramesh | |
| 6,789,689 B1 | 9/2004 | Beale | |
| 6,800,897 B2 | 10/2004 | Baliga | |
| 6,842,368 B2 | 1/2005 | Hayakawa | |
| 6,917,539 B2 | 7/2005 | Rinerson | |
| 6,940,742 B2 | 9/2005 | Yamamura | |
| 6,944,052 B2 | 9/2005 | Subramanian | |
| 6,979,863 B2 | 12/2005 | Ryu | |
| 7,009,877 B1 | 3/2006 | Huai | |
| 7,045,840 B2 | 5/2006 | Tamai | |
| 7,051,941 B2 | 5/2006 | Yui | |
| 7,052,941 B2 | 5/2006 | Lee | |
| 7,098,494 B2 | 8/2006 | Pakala | |
| 7,130,209 B2 | 10/2006 | Reggiori | |
| 7,161,861 B2 | 1/2007 | Gogl | |
| 7,180,140 B1 | 2/2007 | Brisbin | |
| 7,187,577 B1 | 3/2007 | Wang | |
| 7,190,616 B2 | 3/2007 | Forbes | |
| 7,200,036 B2 | 4/2007 | Bessho | |
| 7,215,568 B2 | 5/2007 | Liaw | |
| 7,218,550 B2 | 5/2007 | Schwabe | |
| 7,224,601 B2 | 5/2007 | Panchula | |
| 7,233,537 B2 | 6/2007 | Tanizaki | |
| 7,236,394 B2 | 6/2007 | Chen | |
| 7,247,570 B2 | 7/2007 | Thomas | |
| 7,272,034 B1 | 9/2007 | Chen | |
| 7,272,035 B1 | 9/2007 | Chen | |
| 7,273,638 B2 | 9/2007 | Belyansky | |
| 7,274,067 B2 | 9/2007 | Forbes | |
| 7,282,755 B2 | 10/2007 | Pakala | |
| 7,285,812 B2 | 10/2007 | Tang | |
| 7,286,395 B2 | 10/2007 | Chen | |
| 7,289,356 B2 | 10/2007 | Diao | |
| 7,345,912 B2 | 3/2008 | Luo | |
| 7,362,618 B2 | 4/2008 | Harari | |
| 7,378,702 B2 | 5/2008 | Lee | |
| 7,379,327 B2 | 5/2008 | Chen | |
| 7,381,595 B2 | 6/2008 | Joshi | |
| 7,382,024 B2 | 6/2008 | Ito | |
| 7,397,713 B2 | 7/2008 | Harari | |
| 7,413,480 B2 | 8/2008 | Thomas | |
| 7,414,908 B2 | 8/2008 | Miyatake | |
| 7,416,929 B2 | 8/2008 | Mazzola | |
| 7,432,574 B2 | 10/2008 | Nakamura | |
| 7,440,317 B2 | 10/2008 | Bhattacharyya | |
| 7,465,983 B2 | 12/2008 | Eldridge | |
| 7,470,142 B2 | 12/2008 | Lee | |
| 7,470,598 B2 | 12/2008 | Lee | |
| 7,502,249 B1 | 3/2009 | Ding | |
| 7,515,457 B2 | 4/2009 | Chen | |
| 7,542,356 B2 | 6/2009 | Lee | |
| 7,646,629 B2 | 1/2010 | Hamberg | |
| 7,671,433 B2 | 3/2010 | Sugahara | |
| 7,697,322 B2 | 4/2010 | Leuschner | |
| 7,738,279 B2 | 6/2010 | Siesazeck | |
| 7,738,881 B2 | 6/2010 | Krumm | |
| 7,829,875 B2 | 11/2010 | Scheuerlein | |
| 2001/0046154 A1 | 11/2001 | Forbes | |
| 2002/0081822 A1 | 6/2002 | Yanageta | |
| 2002/0113293 A1 | 8/2002 | Robb | |
| 2002/0136047 A1 | 9/2002 | Scheuerlein | |
| 2003/0045064 A1 | 3/2003 | Kunikiyo | |
| 2003/0168684 A1 | 9/2003 | Pan | |
| 2003/0169625 A1 | 9/2003 | Hush | |
| 2004/0084725 A1 | 5/2004 | Nishiwaki | |
| 2004/0114413 A1 | 6/2004 | Parkinson | |
| 2004/0114438 A1 | 6/2004 | Morimoto | |
| 2004/0256610 A1 | 12/2004 | Lung | |
| 2004/0257878 A1 | 12/2004 | Morikawa | |
| 2004/0262635 A1 | 12/2004 | Lee | |
| 2005/0044703 A1 | 3/2005 | Liu | |
| 2005/0092526 A1 | 5/2005 | Fielder | |
| 2005/0122768 A1 | 6/2005 | Fukumoto | |
| 2005/0145947 A1 | 7/2005 | Russ | |
| 2005/0218521 A1 | 10/2005 | Lee | |
| 2005/0253143 A1 | 11/2005 | Takaura | |
| 2005/0280042 A1 | 12/2005 | Lee | |
| 2005/0280061 A1 | 12/2005 | Lee | |
| 2005/0280154 A1 | 12/2005 | Lee | |
| 2005/0280155 A1 | 12/2005 | Lee | |
| 2005/0280156 A1 | 12/2005 | Lee | |
| 2005/0282356 A1 | 12/2005 | Lee | |
| 2006/0073652 A1 | 4/2006 | Pellizzer | |
| 2006/0076548 A1 * | 4/2006 | Park et al. | 257/2 |
| 2006/0131554 A1 | 6/2006 | Joung | |
| 2006/0275962 A1 | 12/2006 | Lee | |
| 2007/0007536 A1 | 1/2007 | Hidaka | |
| 2007/0077694 A1 | 4/2007 | Lee | |
| 2007/0105241 A1 | 5/2007 | Leuschner | |
| 2007/0113884 A1 | 5/2007 | Kensey | |
| 2007/0115749 A1 | 5/2007 | Gilbert | |
| 2007/0253245 A1 | 11/2007 | Ranjan | |
| 2007/0279968 A1 | 12/2007 | Luo | |
| 2007/0281439 A1 | 12/2007 | Bedell | |
| 2007/0297223 A1 | 12/2007 | Chen | |
| 2008/0007993 A1 | 1/2008 | Saitoh | |
| 2008/0025083 A1 | 1/2008 | Okhonin | |
| 2008/0029782 A1 | 2/2008 | Carpenter | |
| 2008/0032463 A1 | 2/2008 | Lee | |
| 2008/0037314 A1 | 2/2008 | Ueda | |
| 2008/0038902 A1 | 2/2008 | Lee | |
| 2008/0048327 A1 | 2/2008 | Lee | |
| 2008/0094873 A1 | 4/2008 | Lai | |
| 2008/0108212 A1 | 5/2008 | Moss | |
| 2008/0144355 A1 | 6/2008 | Boeve | |
| 2008/0170432 A1 | 7/2008 | Asao | |
| 2008/0180989 A1 * | 7/2008 | Baek et al. | 365/158 |
| 2008/0191312 A1 | 8/2008 | Oh | |
| 2008/0261380 A1 | 10/2008 | Lee | |
| 2008/0265360 A1 | 10/2008 | Lee | |
| 2008/0273365 A1 | 11/2008 | Kang | |
| 2008/0273380 A1 | 11/2008 | Diao | |
| 2008/0310213 A1 | 12/2008 | Chen | |
| 2008/0310219 A1 | 12/2008 | Chen | |
| 2009/0014719 A1 | 1/2009 | Shimizu | |
| 2009/0040855 A1 | 2/2009 | Luo | |
| 2009/0052225 A1 | 2/2009 | Morimoto | |
| 2009/0072246 A1 | 3/2009 | Genrikh | |

| | | | |
|---|---|---|---|
| 2009/0072279 | A1 | 3/2009 | Moselund |
| 2009/0111223 | A1 | 4/2009 | Wiatr |
| 2009/0161408 | A1 | 6/2009 | Tanigami |
| 2009/0162979 | A1 | 6/2009 | Yang |
| 2009/0168394 | A1 | 7/2009 | Kim |
| 2009/0168493 | A1* | 7/2009 | Kim et al. ............. 365/148 |
| 2009/0185410 | A1 | 7/2009 | Huai |
| 2009/0296449 | A1 | 12/2009 | Slesazeck |
| 2010/0007344 | A1 | 1/2010 | Guo |
| 2010/0067281 | A1 | 3/2010 | Xi |
| 2010/0078758 | A1 | 4/2010 | Sekar |
| 2010/0110756 | A1 | 5/2010 | Khoury |
| 2010/0142256 | A1 | 6/2010 | Kumar |
| 2010/0149856 | A1 | 6/2010 | Tang |

FOREIGN PATENT DOCUMENTS

| | | |
|---|---|---|
| EP | 0 281 032 | 9/1988 |
| EP | 1329895 | 7/2003 |
| EP | 1 605 508 | 12/2005 |
| JP | 2007 158325 | 6/2007 |
| WO | WO 0062346 | 10/2000 |
| WO | WO 0215277 | 2/2002 |
| WO | WO 2005/124787 | 12/2005 |
| WO | WO 2006/100657 | 9/2006 |
| WO | WO 2007/100626 | 9/2007 |
| WO | WO 2007/128738 | 11/2007 |

OTHER PUBLICATIONS

Berger et al., Merged-Transitor Logic (MTL)—A Low-Cost Bipolar Logic Concept, Solid-State Circuits, IEEE Journal, vol. 7, Issue 5, pp. 340-346 (2003).

Chung et al., A New SOI Inverter for Low Power Applications, Proceedings 1996 IEEE International SOI Conference, Oct. 1996.

Giacomini, R., et al., Modeling Silicon on Insulator MOS Transistors with Nonrectangular-Gate Layouts, Journal of the Electrochemical Society, 2006, pp. G218-G222, vol. 153, No. 3.

Hosomi et al., A Novel Nonvolatile Memory with Spin Torque Transfer Magnetization Switching: Spin-RAM, 2005 IEEE.

Hwang et al., Degradation of MOSFET's Drive Current Due to Halo Ion Implantation, Electron Devices Meeting, 1996, International Date: Dec. 8-11, 1996, pp. 567-570.

Internet website www.en.wikipedia.org/wiki/High-k dated Nov. 12, 2008.

Likharev, K., "Layered tunnel barrier for nonvolatile memory devices", Applied Physics Letters vol. 73, No. 15; Oct. 12, 1998.

Londergran et al., Interlayer Mediated Epitaxy of Cobalt Silicide on Silicon (100) from Low Temperature Chemical Vapor Deposition of Cobalt, Journal of the Electrochemical Society, 148 (1) C21-C27 (2001) C21.

PCT/ISA/210 Int'l Search Report and PCT/ISA/237 Written Opinion for PCT/US2010/041134 from the EPO.

Romanyuk, A., et al., Temperature-induced metal-semiconductor transition in W-doped VO2 films studied by photoelectron spectroscopy, Solar Energy Materials and Solar Cells, 2007, pp. 1831-1835, No. 91, Elsevier, Switzerland.

Sayan, S., "Valence and conduction band offsets of a ZrO2/SiOxNy/n-Si CMOS gate stack: A combined photoemission and inverse photoemission study", Phys. Stat. Sol. (b) 241, No. 10, pp. 2246-2252 (2004).

Takato et al., High Performance CMOS Surrounding Gate Transistor (SGT) for Ultra High Density LSIs, Downloaded on Apr. 14, 2009 from IEEE Xplore, pp. 222-225.

U.S. Appl. No. 12/175,545, filed Jul. 18, 2008, Inventors: Lou et al.

U.S. Appl. No. 12/120,715, filed May 15, 2008, Inventors: Tian et al.

U.S. Appl. No. 12/498,661, filed Jul. 7, 2009, Inventor: Khoury.

U.S. Appl. No. 12/502,211, filed Jul. 13, 2009, Inventor: Lu.

Wang et al., Precision Control of Halo Implanation for Scaling-down ULSI Manufacturing, IEEE International Symposium on Sep. 13-15, 2005, pp. 204-207.

Zahler, James, et al., Wafer Bonding and Layer Transfer Processes for High Efficiency Solar Cells, NCPV and Solar Program Review Meeting, pp. 723-726, 2003.

PCT Search Report and Written Opinion dated Dec. 15, 2010.

* cited by examiner

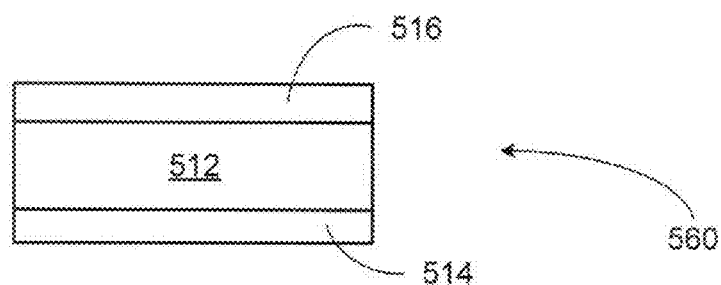
FIG. 5C
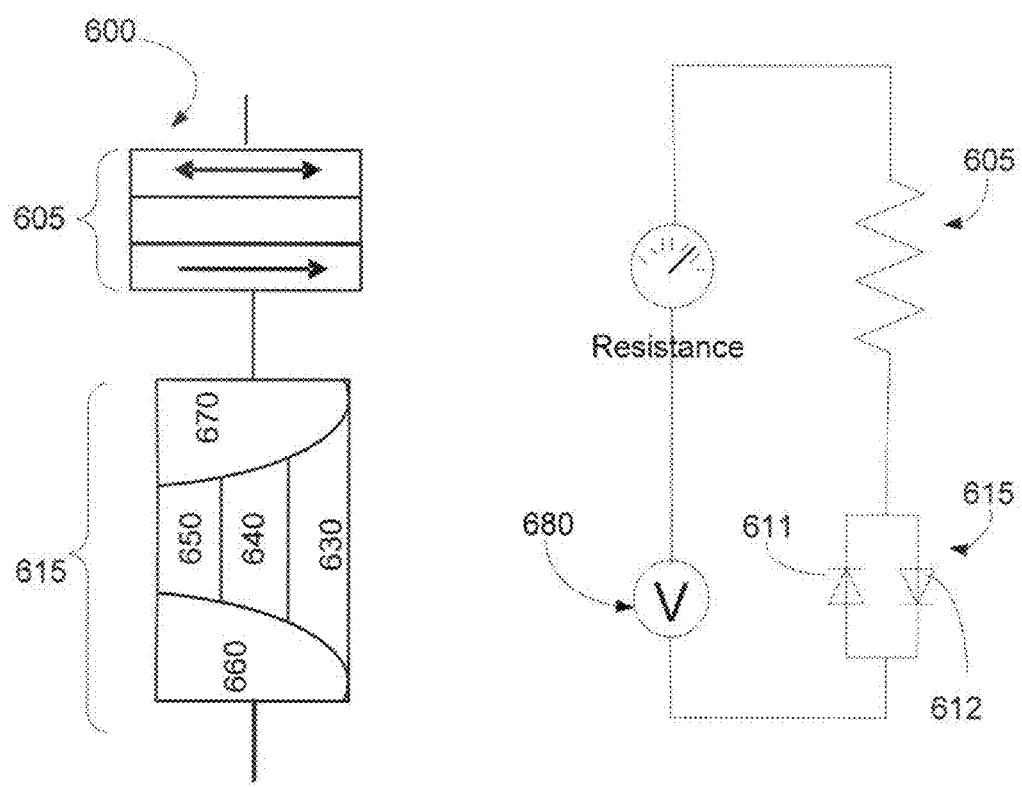
FIG. 6A
FIG. 6B

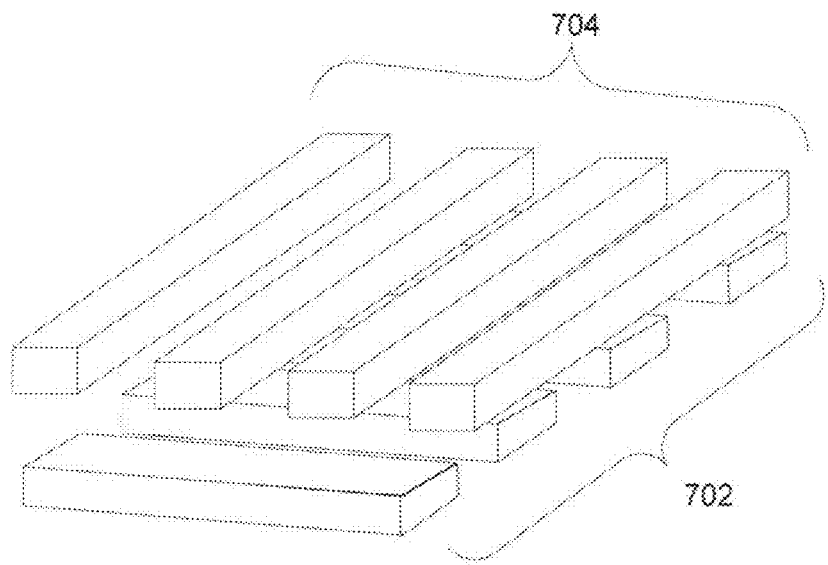
FIG. 7A
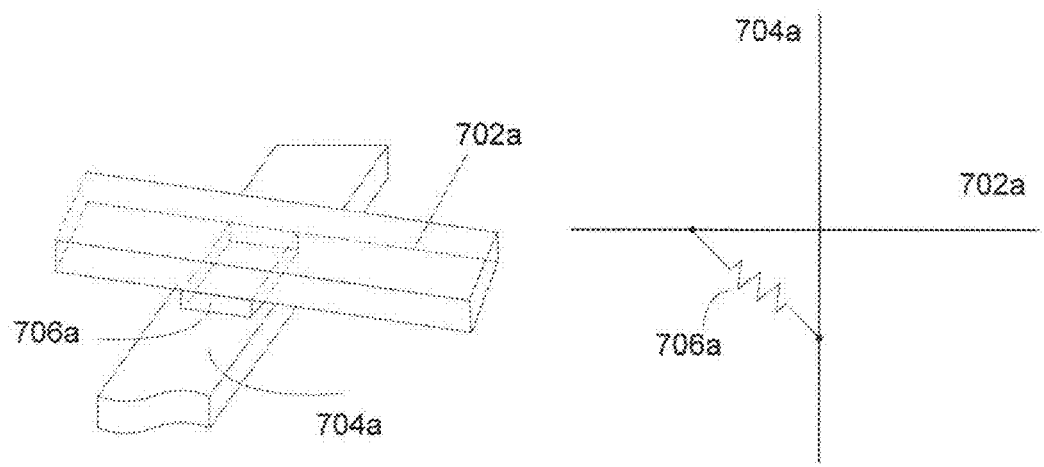
FIG. 7B
FIG. 7C

SCHOTTKY DIODE SWITCH AND MEMORY UNITS CONTAINING THE SAME

BACKGROUND

New types of memory have demonstrated significant potential to compete with commonly utilized types of memory. For example, non-volatile spin-transfer torque random access memory (referred to herein as "STRAM") and resistive random access memory (referred to herein as "RRAM") are both considered good candidates for the next generation of memory. The ability of STRAM and RRAM to more effectively compete with established memory types, such as FLASH memory (NAND or NOR) can be maximized by increasing the density at which memory units (a memory cell and its associated driving device) can be formed on a chip.

BRIEF SUMMARY

Disclosed herein is a switching element that includes a first semiconductor layer, the first semiconductor layer having a first portion and a second portion; a second semiconductor layer, the second semiconductor layer having a first portion and a second portion; an insulating layer disposed between the first semiconductor layer and the second semiconductor layer; a first metal contact in contact with the first portion of the first semiconductor layer forming a first junction and in contact with the first portion of the second semiconductor layer forming a second junction; a second metal contact in contact with the second portion of the first semiconductor layer forming a third junction and in contact with the second portion of the second semiconductor layer forming a fourth junction, wherein the first junction and the fourth junction are Schottky contacts, and the second junction and the third junction are ohmic contacts.

Also disclosed herein is a non volatile memory element that includes a switching device having a first semiconductor layer, the first semiconductor layer having a first portion and a second portion; a second semiconductor layer, the second semiconductor layer having a first portion and a second portion; an insulating layer disposed between the first semiconductor layer and the second semiconductor layer; a first metal contact in contact with the first portion of the first semiconductor layer forming a first junction and in contact with the first portion of the second semiconductor layer forming a second junction; a second metal contact in contact with the second portion of the first semiconductor layer forming a third junction and in contact with the second portion of the second semiconductor layer forming a fourth junction, wherein the first junction and the fourth junction are Schottky contacts, and the second junction and the third junction are ohmic contacts; and a non volatile memory cell, wherein the switching device is electrically connected in series with the non volatile memory cell Also disclosed herein is a method of forming a switching element that includes the steps of: providing a layered article, the layered article including a first semiconductor layer, an insulating layer, and a second semiconductor layer; forming a first mask region, wherein the first mask region protects only a first portion of the layered article; doping only a first portion of the second semiconductor layer using a first energy level; forming a second mask region, wherein the second mask region protects only a second portion of the layered article, wherein the first portion and the second portion of the layered article only partially overlap; doping only a second portion of the first semiconductor layer using a second energy level, wherein the first energy level and the second energy level are different, thereby forming a doped layered article; forming a contact mask on only a portion of the doped layered article; etching a portion of at least the second semiconductor layer, the insulating layer, and the first semiconductor layer; forming a first and a second metal contact in the etched regions of the second semiconductor layer, the insulating layer, and the first semiconductor layer.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIGS. 5A through 5C are schematic diagrams of various types of resistive sense memory (RSM) cells (FIGS. 5A and 5B depict STRAM; and FIG. 5C depict RRAM) that can be utilized in non volatile memory elements disclosed herein;

FIG. 6A is a schematic diagram of a non volatile memory element as disclosed herein;

FIG. 6B is a circuit diagram of a non volatile memory element as disclosed herein;

FIGS. 7A through 7C are perspective views (FIGS. 7A and 7B) and a diagrammatic view (FIG. 7C) of portions of crossbar memory arrays that can incorporate non volatile memory units as disclosed herein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
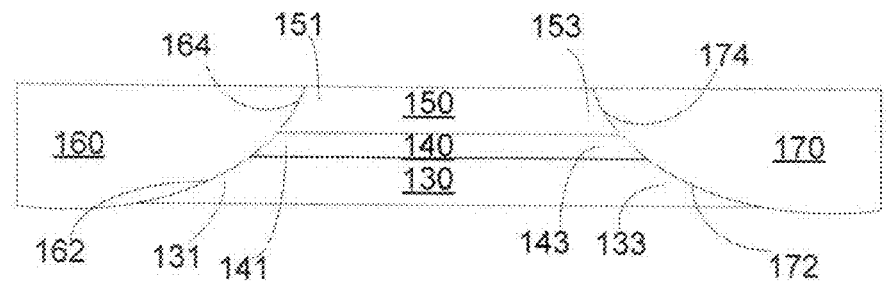
FIG. 1A is a schematic diagram of an embodiment of a switching element disclosed herein.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", and "on top", if used herein, are utilized for ease of description to describe spatial relationships of an element(s) to another. Such spatially related terms encompass different orientations of the device in use or operation in addition to the particular orientations depicted in the figures and described herein. For example, if a cell depicted in the figures is turned over or flipped over, portions previously described as below or beneath other elements would then be above those other elements.

As used herein, when an element, component or layer for example is described as being "on" "connected to", "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

Disclosed herein are electronic devices that can be utilized as switches. The disclosed electronic devices can also be referred to as switching devices or switching elements. Generally, a switch is an electrical component that can break an electrical circuit, interrupting the current or diverting it from one conductor to another. Switches as disclosed herein can also be referred to as bi-directional switches. A bi-directional switch can break an electrical circuit and can also direct current through the switch either way. The switching devices can be utilized in applications which previously utilized or would have utilized a diode, as well as other applications. Switching devices disclosed herein can also withstand high driving currents.

An embodiment of a switching device as disclosed herein can be seen in FIG. 1A. The exemplary switching device includes a first semiconductor layer 130, an insulating layer 140, a second semiconductor layer 150, a first metal contact 160, and a second metal contact 170. As seen in FIG. 1A, the insulating layer 140 (which can also be referred to in embodiments as the first insulating layer 140) can be positioned between the first semiconductor layer 130 and the second semiconductor layer 150. In embodiments, the insulating layer 140 can be positioned directly between the first semiconductor layer 130 and the second semiconductor layer 150 and is in contact with both the first semiconductor layer 130 and the second semiconductor layer 150.

In embodiments, the first metal contact 160 is adjacent to the first semiconductor layer 130, the insulating layer 140, and the second semiconductor layer 150. In embodiments, the first metal contact 160 is adjacent to first portions 131, 141, and 151 respectively of the first semiconductor layer 130, the insulating layer 140, and the second semiconductor layer 150. In embodiments, the first metal contact 160 is in contact with the first portions 131, 141, and 151 of the first semiconductor layer 130, the insulating layer 140, and the second semiconductor layer 150. In embodiments, the first metal contact 160 is in direct contact with the first portions 131, 141, and 151 of the first semiconductor layer 130, the insulating layer 140, and the second semiconductor layer 150.

In embodiments, the second metal contact 170 is adjacent to the first semiconductor layer 130, the insulating layer 140, and the second semiconductor layer 150. In embodiments, the second metal contact 170 is adjacent to second portions 133, 143, and 153 respectively of the first semiconductor layer 130, the insulating layer 140, and the second semiconductor layer 150. In embodiments, the second metal contact 170 is in contact with the second portions 133, 143, and 153 of the first semiconductor layer 130, the insulating layer 140, and the second semiconductor layer 150. In embodiments, the second metal contact 170 is in direct contact with the second portions 133, 143, and 153 of the first semiconductor layer 130, the insulating layer 140, and the second semiconductor layer 150.

The first portion 131 of the first semiconductor layer 130 contacts the first metal contact 160 at a first junction 162; the first portion 151 of the second semiconductor layer 150 contacts the first metal contact 160 at a second junction 164; the second portion 133 of the first semiconductor layer 130 contacts the second metal contact 170 at a third junction 172; and the second portion 153 of the second semiconductor layer 150 contacts the second metal contact 170 at a fourth junction 174. The first, second, third, and fourth junctions 162, 164, 172, and 174 are either ohmic or Schottky junctions.

Whenever a metal and a semiconductor are in intimate contact, there exists a potential barrier between the two materials that prevents most charge carriers (electrons or holes) from passing from one material to the other material. Only a small number of carriers have enough energy to get over the barrier and cross to the other material. When a bias is applied to the junction, it can have one of two effects: it can make the barrier appear lower from the semiconductor side, or it can make it appear higher from the semiconductor side. The bias does not change the barrier height from the metal side. The result of this is a Schottky Barrier, which can also be referred to as a Schottky junction, or a rectifying contact, where the junction conducts for one bias polarity, but not the other. Ohmic contacts on the other hand, conduct the same for both polarities. An ohmic contact or an ohmic junction has a linear and symmetric current-voltage (I-V) curve; a Schottky contact or a Schottky junction has a non-linear and asymmetric current-voltage (I-V) curve.

Whether a particular metal-semiconductor junction will be an ohmic junction or a Schottky junction can depend at least in part on the work function of the metal, the band gap of the semiconductor, the type and concentration of dopants in the semiconductor, and other factors. In general, a junction of a heavily doped semiconductor and a metal forms a thinner energy barrier (the heavier the dopant level, the thinner the barrier will be). At reverse bias conditions, charge will flow through the barrier due to quantum mechanical tunneling. In embodiments, a junction of a heavily doped semiconductor material and a metal will form an ohmic junction (the current will flow in either direction: forward biased current in one direction, tunneling in the other (reverse) direction) and a junction of an undoped or lightly doped semiconductor material and a metal will form a Schottky junction.

In embodiments of switching elements disclosed herein, the first semiconductor layer 130 will have one ohmic contact and one Schottky contact and the second semiconductor layer 150 will have one ohmic contact and one Schottky contact. The orientation of the Schottky contact and the ohmic contact within the first semiconductor layer 130 will generally be opposite of the orientation of the Schottky contact and the ohmic contact within the second semiconductor layer 150. In embodiments, the first junction 162 can be a Schottky junction, the second junction 164 can be an ohmic junction, the third junction 172 can be an ohmic junction, and the fourth junction 174 can be a Schottky junction. In embodiments, the first junction 162 can be an ohmic junction, the second junction 164 can be a Schottky junction, the third junction 172 can be a Schottky junction, and the fourth junction 174 can be an ohmic junction.

Figure 1B:
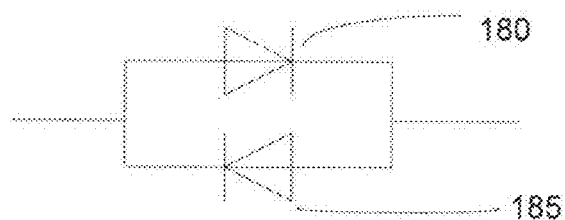
FIG. 1B is a circuit diagram depicting the functioning of a switching element disclosed herein.
Figure 1C:
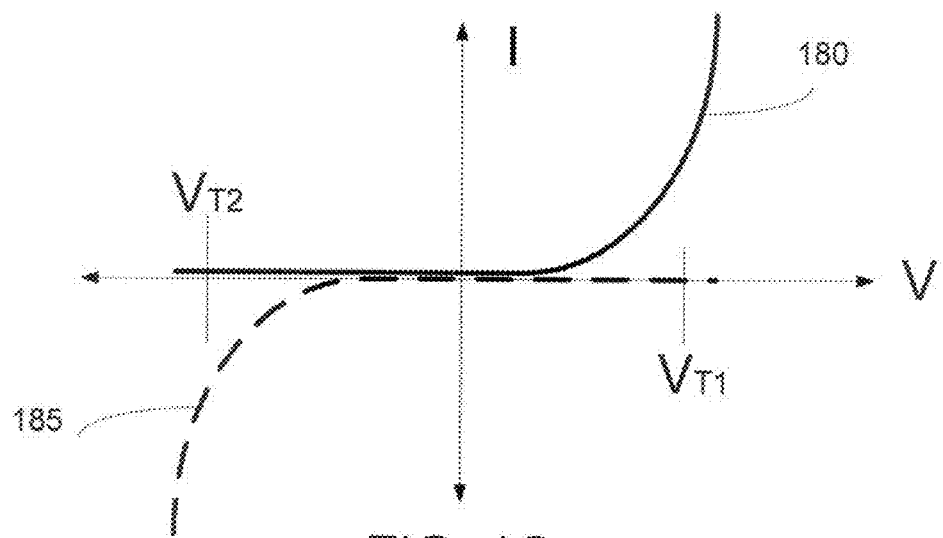
FIG. 1C is a current-voltage (I-V) curve of a hypothetical switching element disclosed herein.

The opposite orientation of the Schottky contacts and ohmic contacts within the first and second semiconductor layers 130 and 150 render switching elements having such a configuration a bidirectional switch. A bidirectional switch allows current to flow in a first direction when a current having a first polarity is applied and allows current to flow in a second direction (opposite the first direction) when a current having a second polarity (opposite the first polarity) is applied. FIG. 1B depicts a circuit diagram that illustrates the bidirectional nature of the switching elements disclosed herein. As seen in the circuit diagram of FIG. 1B, the first semiconductor layer and the second semiconductor layer provide the function of a first diode 180 and a second diode 185 respectively that are in parallel. The first diode 180 allows current to flow in an opposite direction than does the second diode 185. FIG. 1C shows a current-voltage (I-V) curve for a hypothetical disclosed switching element. As seen in FIG. 1C, the first diode 180 has a threshold voltage $V_{T1}$ at which a substantial current begins to flow in a first direction; and the second diode 185 has a threshold voltage $V_{T2}$ at which a substantial current begins to flow in a second direction. As shown in FIG. 1C, the polarity of $V_{T1}$ and $V_{T2}$ are opposite, as is the current that flows from the switching element at the two voltages. This provides a switching element that essentially blocks current between the voltages $V_{T1}$ and $V_{T2}$ and allows current having a first polarity to flow at voltages below $V_{T2}$ and a second polarity to flow at voltages above $V_{T1}$.

In functioning as a switch, this means that if a voltage of less than $V_{T2}$ is applied to the switching element, a current will flow in a first direction; whereas if a voltage of greater than $V_{T1}$ is applied to the switching element, a current will flow in a second direction. The switching element can therefore be utilized to control the direction in which current flows through an electrically connected component, such as for example a non volatile memory cell.

Switching elements as disclosed herein can advantageously provide the combination of bi-directional switching and the ability to withstand high driving current. The switching elements disclosed herein can be used where high driving current is necessary because of the relatively larger (as compared with conventional MOS transistors) cross-section of the current path of the disclosed switching element which makes it capable of flowing a relatively large amount of current. The ability to handle high driving currents can be advantageous because the switch can then be utilized with components where a high driving current is necessary, or desired, an example of which is spin torque transfer random access memory (STRAM).

Figure 2A:
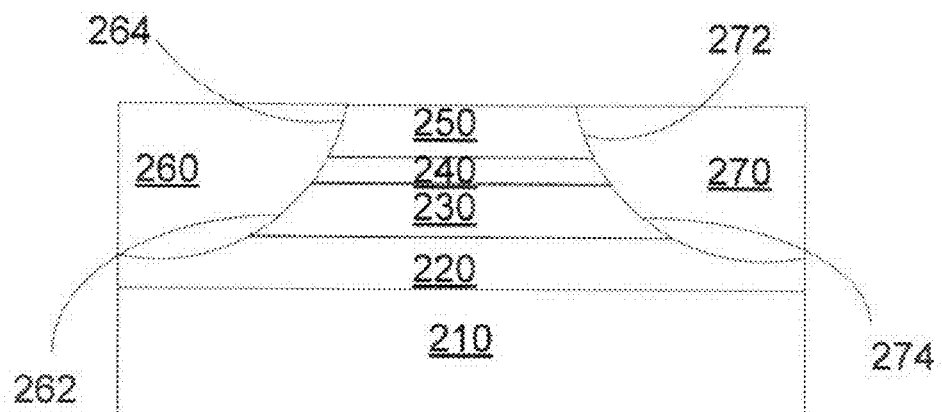
FIGS. 2A and 2B are schematic diagrams of switching elements disclosed herein.

FIG. 2A illustrates another embodiment of a switching element disclosed herein. The switching element in FIG. 2A includes the components discussed above and also includes other components. For example, adjacent the first semiconductor layer 230 can be another insulating layer 220, which can also be referred to as the second insulating layer 220. In embodiments, the second insulating layer 220 can be directly adjacent to the first semiconductor layer 230. The second insulating layer 220 can function to electrically insulate the first semiconductor layer 230 from the substrate 210. The substrate can be an electrically conductive, or a semiconductive material. The substrate 210 can function to provide the switching element structural stability and can aid in the formation process of the switching element.

The hypothetical I-V curve that is illustrated in FIG. 1C is symmetrical. Generally, in order for the I-V curve of a disclosed switching element to be symmetrical, the path lengths across the first semiconductor layer and the second semiconductor layer have to be at least substantially the same and the surface area of the metal/semiconductor junctions (e.g., 162, 164, 172, and 174), have to be at least substantially the same. A switching element that does not have symmetrical first and second semiconductor layers and/or substantially the same surface areas can be modified to become less asymmetrical. This can be accomplished for example, by modifying the components that make up the switching element, by altering the dopants (either the identity or the amount), by altering one or both of the metal contacts, by changing other factors not discussed herein, or by altering a combination of these factors. A switching element that has a symmetrical I-V curve can be advantageous in some applications. For example, it can be advantageous for a switching element that is to be used in combination with memory elements to have a symmetrical I-V curve.

The exemplary switching element illustrated in FIG. 2A can be relatively easily manufactured to have a symmetrical I-V curve because it is generally a relatively simple matter to make the thicknesses of the first and second semiconductor layers substantially the same. In embodiments, a switching element that has a first semiconductor layer and a second semiconductor layer having substantially the same thickness will most likely have a symmetrical I-V curve.

Figure 2B:
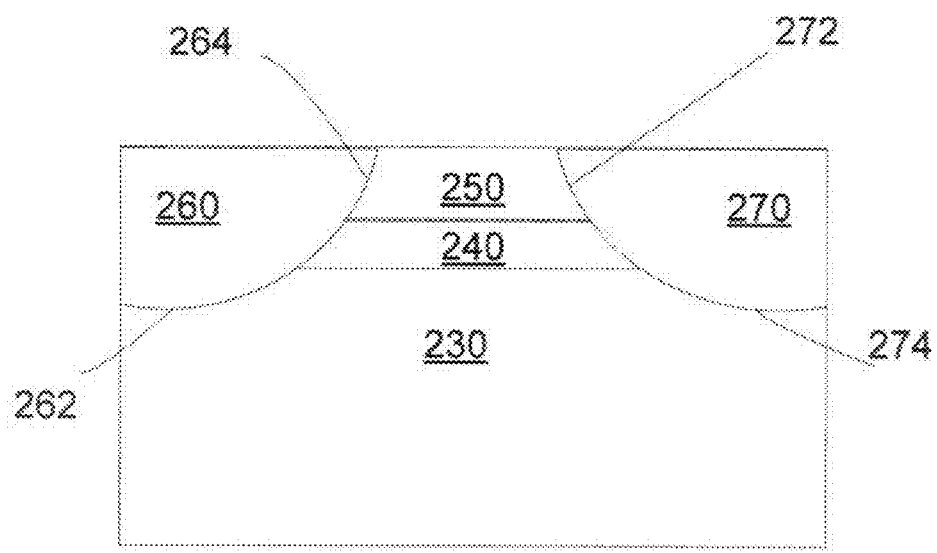

The exemplary switching element illustrated in FIG. 2B will most likely not have a symmetrical I-V curve. As seen in FIG. 2B, the illustrated switching element has a first semiconductor layer 230 that is significantly thicker than the second semiconductor layer 250; and the first junction 262 and the third junction 274, which are those of the first semiconductor layer 230 have significantly more surface area than the junctions of the second semiconductor layer 250 (namely second junction 264 and fourth junction 272 with first metal contact 260 and second metal contact 270). This will most likely lead to the first semiconductor layer 230 having a higher threshold voltage than the second semiconductor layer 250. Such a switching element would therefore most likely have an asymmetric I-V curve.

The first semiconductor layer and the second semiconductor layer can include any semiconductive material. The first semiconductor layer and the second semiconductor layer can be, but need not be the same material. Exemplary semiconductors that can be utilized for the first semiconductor layer, the second semiconductor layer, or both include, but are not limited to, silicon, silicon containing compounds, germanium, germanium containing compounds, aluminium containing compounds, boron containing compounds, gallium containing compounds, indium containing compounds, cadmium containing compounds, zinc containing compounds, lead containing compounds, tin containing compounds. Exemplary elemental and compound semiconductors include, but are not limited to, Silicon, for example crystalline silicon, Germanium, Silicon carbide (SiC), Silicon germanium (SiGe), Aluminium antimonide (AlSb), Aluminium arsenide (AlAs), Aluminium nitride (AlN), Aluminium phosphide (AlP), Boron nitride (BN), Boron phosphide (BP), Boron arsenide (BAs), Gallium antimonide (GaSb), Gallium arsenide (GaAs), Gallium nitride (GaN), Gallium phosphide (GaP), Indium antimonide (InSb), Indium arsenide (InAs), Indium nitride (InN), Indium phosphide (InP), Aluminium gallium arsenide (AlGaAs, AlxGa1-xAs), Indium gallium arsenide (InGaAs, InxGa1-xAs), Indium gallium phosphide (InGaP), Aluminium indium arsenide (AlInAs), Aluminium indium antimonide (AlInSb), Gallium arsenide nitride (GaAsN), Gallium arsenide phosphide (GaAsP), Aluminium gallium nitride (AlGaN), Aluminium gallium phosphide (AlGaP), Indium gallium nitride (InGaN), Indium arsenide antimonide (InAsSb), Indium gallium antimonide (InGaSb), Aluminium gallium indium phosphide (AlGaInP, also InAlGaP, InGaAlP, AlInGaP), Aluminium gallium arsenide phosphide (AlGaAsP), Indium gallium arsenide phosphide (InGaAsP), Aluminium indium arsenide phosphide (AlInAsP), Aluminium gallium arsenide nitride (AlGaAsN), Indium gallium arsenide nitride (InGaAsN), Indium aluminium arsenide nitride (InAlAsN), Gallium arsenide antimonide nitride (GaAsSbN), Gallium indium nitride arsenide antimonide (GaInNAsSb), Gallium indium arsenide antimonide phosphide (GaInAsSbP), Cadmium selenide (CdSe), Cadmium sulfide (CdS), Cadmium telluride (CdTe), Zinc oxide (ZnO), Zinc selenide (ZnSe), Zinc sulfide (ZnS), Zinc telluride (ZnTe), Cadmium zinc telluride (CdZnTe, CZT), Mercury cadmium telluride (HgCdTe), Mercury zinc telluride (HgZnTe), Mercury zinc selenide (HgZnSe), Cuprous chloride (CuCl), Lead selenide (PbSe), Lead sulfide (PbS), Lead telluride (PbTe), Tin sulfide (SnS), Tin telluride (SnTe), Lead tin telluride (PbSnTe), Thallium tin telluride ($Tl_2SnTe_5$), Thallium germanium telluride ($Tl_2GeTe_5$), Bismuth telluride ($Bi_2Te_3$), Cadmium phosphide ($Cd_3P_2$), Cadmium arsenide ($Cd_3As_2$), Cadmium antimonide ($Cd_3Sb_2$), Zinc phosphide ($Zn_3P_2$), Zinc arsenide ($Zn_3As_2$), and Zinc antimonide ($Zn_3Sb_2$).

A portion of both the first semiconductor layer and the second semiconductor layer are doped. Doping is the process of intentionally introducing impurities into a semiconductor to change its electrical properties. The particular dopant that is chosen can depend at least in part on the particular properties that are desired in the final switching element, the identity of the semiconductor material to be doped, other factors not discussed herein, or a combination thereof. Exemplary dopants can include, but are not limited to Group III and Group V elements. In embodiments where the semiconductor materials are Group IV materials (for example, silicon, germanium, and silicon carbide), Group III or Group V elements can be utilized as dopants. Specific exemplary dopants can include, but are not limited to boron (B), arsenic (As), phosphorus (P), and gallium (Ga).

The first insulating layer and the optional second insulating layer can be made of any material that is electrically insulating. The first insulating layer and the optional second insulating layer can be, but need not be the same material. Exemplary insulating materials include, but are not limited to, oxides, such as alumina ($Al_2O_3$), silicon oxide ($SiO_2$), and magnesium oxide (MgO) for example.

The metal contacts can be made of any metallic material that is electrically conductive. The first metal contact and the second metal contact can be, but need not be the same material. Exemplary metal electrically conductive materials include, but are not limited to tungsten (W) or a noble metal such as gold (Au), platinum (Pt), palladium (Pd), rhodium (Rh), copper (Cu), Nickel (Ni), Silver (Ag), Cobalt (Co), Iron (Fe), or their silicides.

In embodiments, the first and second semiconductor layers both are made of crystalline silicon. In embodiments, the first and second semiconductor layers are doped with boron, phosphorus, or arsenic. In embodiments, the first insulating layer and the second insulating layer if present are made of silicon oxide ($SiO_2$). In embodiments, the metal contacts are tungsten (W), a nickel silicide, or a cobalt silicide.

Figure 3:
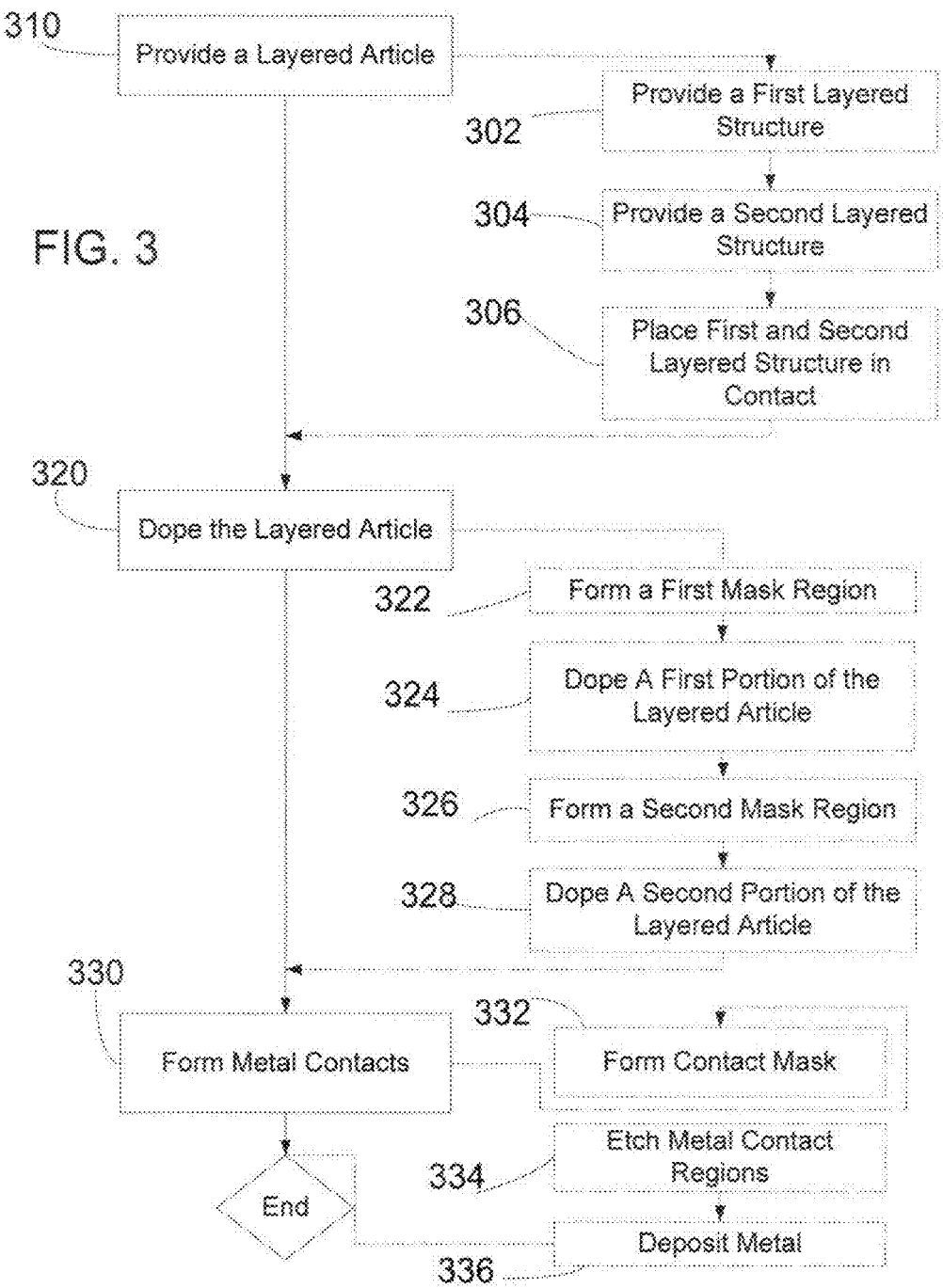
FIG. 3 is a flow chart depicting an exemplary method of forming a switching element.

An exemplary method of fabrication for a switching element, such as that depicted in FIG. 2A is provided in FIG. 3 and is demonstrated stepwise in FIGS. 4A through 4G. Generally, such fabrication schemes can include semiconductor fabrication methods including photolithography techniques and other removal techniques such as etching, and chemical mechanical planarization (CMP). Deposition methods, including but not limited to, plasma vapor deposition (PVD), ionized plasma based sputtering, long throw sputtering, chemical vapor deposition (CVD), atomic layer deposition (ALD), and metal organic chemical vapor deposition (MOCVD) can be utilized to deposit the various layers deposited in the exemplary method. The steps depicted in FIG. 3 and the depiction thereof in FIGS. 4A to 4G in no way limit the way in which a switching element as disclosed herein can be fabricated. It should also be noted that FIGS. 4A through 4G are not necessarily to scale and do not necessarily depict the article at every state of preparation, i.e. some intermediate stages of the article may not be illustrated in the sequence of figures. The materials and processes discussed with respect to FIGS. 4A to 4G also in no way limit materials or processes that can be utilized herein.

The exemplary method illustrated in FIG. 3 and FIGS. 4A through 4G depict the use of a substrate. One of skill in the art, having read this specification, will understand that use of a substrate is not necessary, switching elements as disclosed herein can be fabricated without use of a substrate, the switching element can be placed on a support after fabrication, a substrate can be utilized and then removed either during or after fabrication of the switching element, or a substrate does not need to be utilized at all. The substrate, if utilized, can include materials such as silicon, a mixture of silicon and germanium, or other similar materials.

A flowchart depicting an exemplary method of fabricating a switching element disclosed herein is shown in FIG. 3. The first step in the exemplary method is step 310, providing a layered article. The layered article includes at least a first semiconductor layer, an insulating layer (which can also be referred to as a first insulating layer) and a second semiconductor layer, and has the insulating layer positioned between the first semiconductor layer and the second semiconductor layer. An exemplary layered article 402 can be seen in FIG. 4B and includes a substrate 410, a second insulating layer 420, a first semiconductor layer 430, a first insulating layer 440, and a second semiconductor layer 450. It should be understood, having read this specification, that a layered article could have more or less layers than that depicted in FIG. 4B. The layered article can be fabricated or obtained, for example through commercially available sources.

Figure 4A:
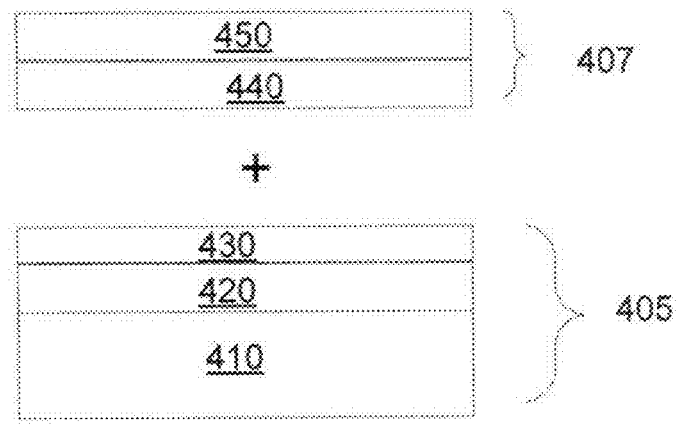
FIGS. 4A though 4G depict a switching element at various stages of fabrication.

Exemplary optional steps that can be utilized to fabricate the layered article are seen in steps 302, 304, and 306. Step 302 includes providing a first layered structure. The first layered structure can include at least a first substrate, a second insulating layer and the first semiconductor layer, and has the second insulating layer positioned between the first substrate and the first semiconductor layer. An example of a first layered structure can include a substrate (for example a silicon wafer), having an insulating layer disposed thereon and the first semiconductor layer disposed on the insulating layer. The insulating layer of the first layered structure (the second insulating layer) can be formed by depositing an insulating material or by oxidizing a portion of the substrate to form an insulating material from a portion of the substrate (for example $SiO_2$). An exemplary first layered structure 405 is shown in FIG. 4A and includes the substrate 410, the second insulating layer 420 and the first semiconductor layer 430.

Step 304 includes providing a second layered structure. The second layered structure can include at least an insulating layer (which can be referred to as the first insulating layer) and a second semiconductor layer, and has the insulating layer disposed on the second semiconductor layer (or vice versa). An example of a second layered structure can include an oxidized substrate (for example a silicon wafer), where the oxidized portion becomes the insulating layer and the unoxidized portion becomes the second semiconductor layer. Alternatively, a semiconductor material (such as a silicon wafer) can have an insulating material deposited thereon to form the insulating layer on the second semiconductor layer. In embodiments where a substrate, such as a silicon wafer, is utilized to form the second layered structure, a portion of the silicon wafer can be removed to adjust the thickness of the second semiconductor layer. This can be accomplished using techniques such as chemical mechanical planning (CMP) for example. An exemplary second layered structure 407 is shown in FIG. 4A and includes the insulating layer 440 and the second semiconductor layer 450.

Figure 4B:
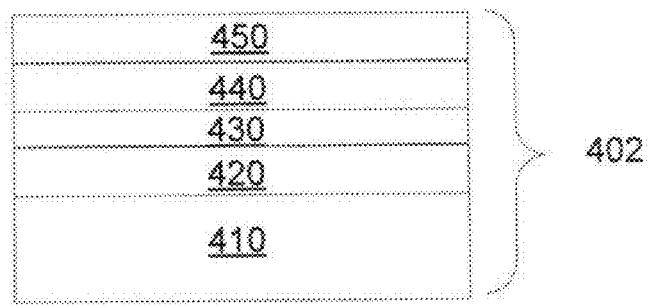

Step 306 includes placing the first layered structure in contact with the second layered structure (or vice versa). The first and second layered structures are configured so that the insulating layer of the second layered structure is adjacent the first semiconductor layer of the first layered structure to form the layered article. In embodiments, the first semiconductor layer of the first layered structure is directly adjacent to or in direct contact with the insulating layer of the second layered structure. The first and second layered structures can then be bonded together using wafer bonding techniques. Completion of this step forms the layered article 402 that is seen in FIG. 4B.

However the layered article is provided (whether via steps 302, 304, and 306 or otherwise), the next step in a method of forming a switching element is step 320, doping the layered article. The step of doping the layered article functions to dope a portion of the first semiconductor layer and a portion of the second semiconductor layer. More specifically, the step of doping the layered article functions to dope a first portion of the second semiconductor layer and a second portion of the first semiconductor layer (or vice versa). Exemplary optional steps that can be undertaken to dope the layered article are shown in steps 322, 324, 326, and 328.

Step 322 includes forming a first mask region. The mask regions (both the first mask region and the second mask region that will be discussed below) are made of materials that prevent the implantation of dopants into materials positioned below them (above and below in this context are defined by the location of the dopant source, with the dopant source being positioned above all of the layers of the layered article and the mask regions). Exemplary materials that can be utilized as mask regions include, but are not limited to, oxide materials, silicon nitrides, or photoresist. The first mask region protects only a portion of the layered article from implantation. The article depicted in FIG. 4C includes a first mask region 411.

Figure 4C:
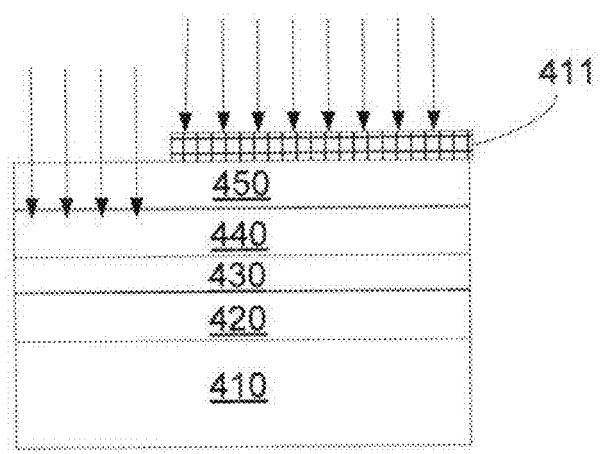

The next step, step 324, includes doping a portion of the layered article. The first mask region (formed in step 322) allows doping of only a portion, for example a first portion, of the layered article. As seen in FIG. 4C, implantation (depicted by the arrows) is prevented under the first mask region and is allowed where the first mask region is not covering the layered article. Doping the first portion of the layered article is accomplished using a first energy level. In embodiments, doping the first portion results in the second semiconductor layer 450 being heavily doped and the first semiconductor layer 430 being only lightly doped or substantially not doped at all. Differential doping levels (or doping and substantially no doping) can be accomplished by using different energy levels.

Figure 4D:
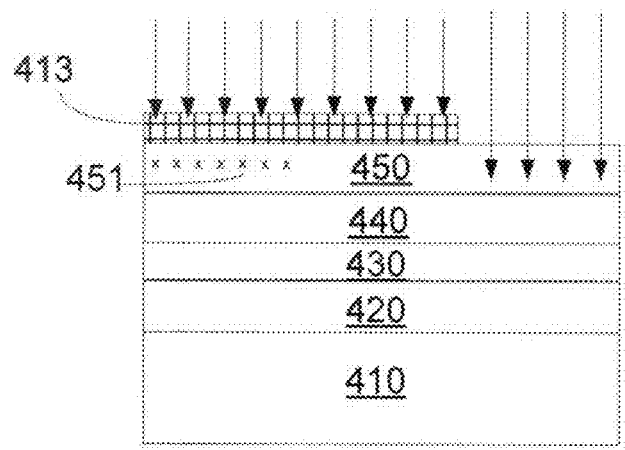

Step 324, as depicted herein accomplishes preferential doping of the second semiconductor layer 450 (which is the upper layer of the layered article as depicted in this embodiment). Preferential doping of only an upper layer or layers of a layered structure can be accomplished by doping using a lower implantation energy. Doping using lower energy can afford the dopant only enough energy to penetrate to a certain depth. FIG. 4D depicts the dopants 451 that are present in the second semiconductor layer 450 after completion of step 324.

Step 326, includes forming a second mask region. The second mask region protects only a portion of the layered article from implantation. The article depicted in FIG. 4D includes a second mask region 413. The location of the first mask region 411 and the second mask region 413 can at least partially overlap. In embodiments, the first mask region 411 and the second mask region 413 do not fully overlap and only partially overlap. The second mask region 413 generally protects at least the portion of the second semiconductor layer 450 that was doped in step 324. In embodiments, the second mask region 413 generally protects the portion of the second semiconductor layer 450 that was doped in step 324 as well as a portion of the second semiconductor layer 450 that was not doped in step 324.

Figure 4E:
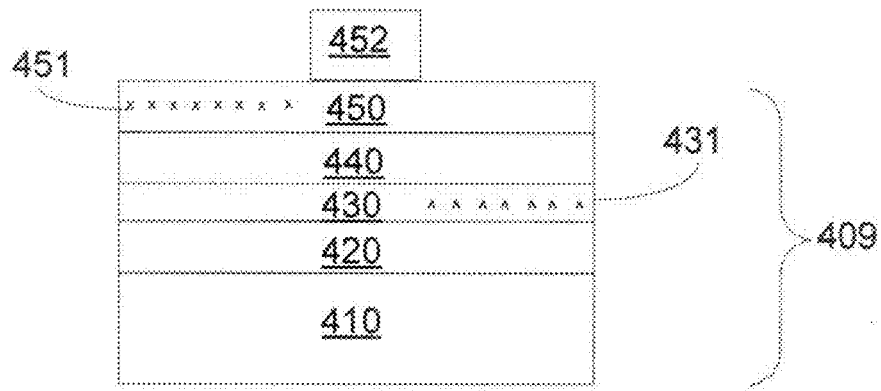

The next step, step 328, includes doping a portion of the layered article. The second mask region (formed in step 326) allows doping of only a portion, for example a second portion, of the layered article. As seen in FIG. 4D, implantation (depicted by the arrows) is prevented under the second mask region and is allowed where the second mask region is not covering the layered article. Doping the second portion of the layered article is accomplished using a second energy level. The second energy level is different than the first energy level (used for doping the first portion). In embodiments, doping the second portion results in the first semiconductor layer 430 being heavily doped and the second semiconductor layer 450 being only lightly doped or substantially not doped at all. Doping using a higher energy implants the dopants deeper into the layered article. Higher energy level doping also generally does not deposit dopants or at least not a substantial amount of dopants in the upper layers of the layered article. FIG. 4E depicts the dopants 431 that are present in the first semiconductor layer 430 after completion of step 328.

The effect of step 320, or the optional steps 322, 324, 326, and 328, is to dope or heavily dope only a first portion of the second semiconductor layer 450 and dope or heavily dope only a second portion of the first semiconductor layer 430. This opposite configuration of doped or heavily doped regions in the first and second semiconductor layers 430 and 450 form the oppositely aligned ohmic and Schottky junctions (after formation of the metal contacts) in the first and second semiconductor layer 430 and 450. The effect of step 320 is to form what is referred to herein as a doped layered article, which is seen in FIG. 4, and is designated as 409.

Figure 4F:
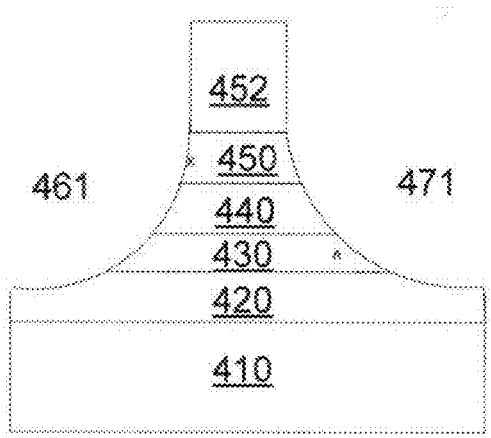

The next step in the method depicted in FIG. 3 is step 330, formation of the metal contacts. Generally, formation of the metal contacts can be accomplished using etching and deposition techniques. Exemplary specific optional steps that can be undertaken to form the metal contacts are shown in steps 332, 334, and 336. The first step in this optional method of forming the metal contacts is step 332, forming a contact mask. The contact mask 452, which is depicted in FIG. 4F generally only masks a portion of the doped layered article. In embodiments, the contact mask 452 masks a region of the doped layered article that is not doped in either the first semiconductor layer 450 or the second semiconductor layer 430. It can also be said that the contact mask 452 masks at least the portion of the doped layered article where the first mask region 411 and the second mask region 413 provided protection from doping. Generally, the contact mask is located in the middle of the doped layered article. In embodiments, the contact mask 452 is located such that once the doped layered article is etched, at least a portion of the doped first semiconductor layer and the doped second semiconductor layer will remain.

The next step, step 334 includes etching the doped layered article using the contact mask 452. This step functions to remove a portion or portions of the doped layered article. The portions not protected by the contact mask 452 are removed from the doped layered article. Etching can be said to form first and second metal contact regions 461 and 471. The first and second metal contact regions 461 and 471 will eventually be filled in with metal to form the metal contacts. Etching can be carried out using known etching techniques and methods.

Figure 4G:
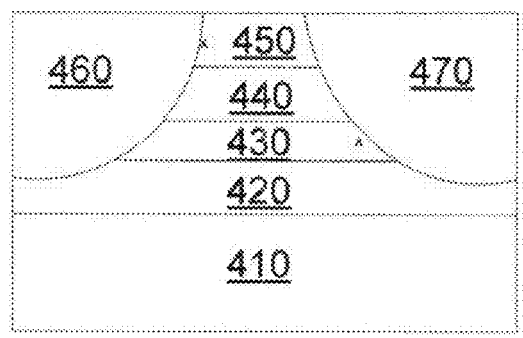

The next step, step 336 includes depositing metal in the first and second metal contact regions 461 and 471. In embodiments, metal can be deposited in more than just the first and second metal contact regions 461 and 471. In embodiments, metal can be deposited on the entire doped layered article to a depth that fills the first and second metal contact regions 461 and 471 and also provides a layer on the region that was previously masked by the contact mask 452. The extra metal can then be removed via CMP for example so that the only location that metal remains is the first and second metal contact regions 461 and 471 to form the first and second metal contacts 460 and 470. FIG. 4G depicts the layered article after formation of the first and second metal contacts 460 and 470, forming the switching element.

Other optional fabrication steps not depicted or discussed herein can also be carried out before, after, during, or a combination thereof, the steps discussed and exemplified herein. The method can also be carried out to fabricate more than one switching element at one time.

Switching elements as disclosed herein can be utilized along with a non volatile memory cell as a selective element for the non volatile memory cell. A non volatile memory cell utilized in a memory device as described herein can include many different types of memory. An exemplary type of non volatile memory cell that can be utilized in electronic devices disclosed herein includes, but is not limited to resistive sense memory (RSM) cells. Exemplary RSM cells include, but are not limited to, ferroelectric RAM (FeRAM or FRAM); magnetoresistive RAM (MRAM); resistive RAM (RRAM); phase change memory (PCM) which is also referred to as PRAM, PCRAM and C-RAM; programmable metallization cell (PMC) which is also referred to as conductive-bridging RAM or CBRAM; and spin torque transfer RAM, which is also referred to as STRAM.

Figure 5A:
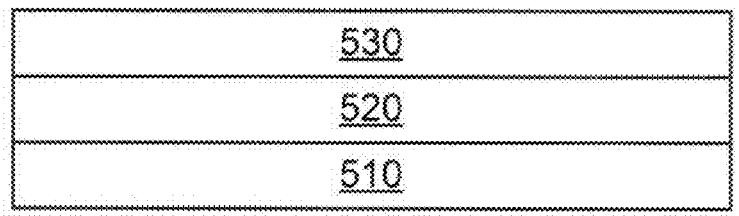
Figure 5B:
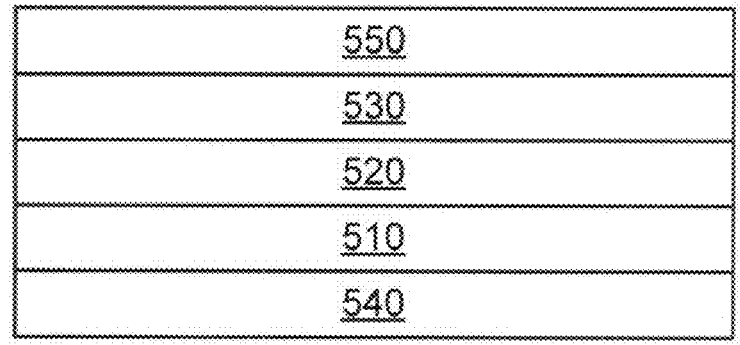

In embodiments, the RSM cell can be a STRAM cell. STRAM memory cells include a MTJ (magnetic tunnel junction), which generally includes two magnetic electrode layers separated by a thin insulating layer, which is also known as a tunnel barrier. An embodiment of a MTJ is depicted in FIG. 5A. The MTJ 500 in FIG. 5A includes a first magnetic layer 510 and a second magnetic layer 530, which are separated by an insulating layer 520. The first magnetic layer 510 and the second magnetic layer 530 may both independently be multilayer structures. FIG. 5B depicts a MTJ 500 in contact with a first electrode layer 540 and a second electrode layer 550.

The first electrode layer 540 and the second electrode layer 550 electrically connect the first magnetic layer 510 and the second magnetic layer 530 respectively to a control circuit (not shown) providing read and write currents through the magnetic layers. The relative orientation of the magnetization vectors of the first magnetic layer 510 and the second magnetic layer 530 can be determined by the resistance across the MTJ 500; and the resistance across the MTJ 500 can be determined by the relative orientation of the magnetization vectors of the first magnetic layer 510 and the second magnetic layer 530.

The first magnetic layer 510 and the second magnetic layer 530 are generally made of ferromagnetic alloys such as iron (Fe), cobalt (Co), and nickel (Ni) alloys. In embodiments, the first magnetic layer 510 and the second magnetic layer 530 can be made of alloys such as FeMn, NiO, IrMn, PtPdMn, NiMn and TbCo. The insulating layer 520 is generally made of an insulating material such as aluminium oxide ($Al_2O_3$) or magnesium oxide (MgO).

The magnetization of one of the magnetic layers, for example the first magnetic layer 510 is generally pinned in a predetermined direction, while the magnetization direction of the other magnetic layer, for example the second magnetic layer 530 is free to rotate under the influence of a spin torque. Pinning of the first magnetic layer 510 may be achieved through, e.g., the use of exchange bias with an antiferromagnetically ordered material such as PtMn, IrMn and others.

A particular MTJ 500 can be read from by allowing a first current to flow through the memory cell in the direction of the second magnetic layer 530 (the free layer) to the first magnetic layer 510 (the pinned layer). The resistance of the MTJ 500 can change depending on whether the free layer is aligned with or aligned opposite to the pinned layer. A voltage, dependent on the resistance can then be detected and compared to a reference voltage determine whether the MTJ is aligned or opposite, i.e., contains a "1" or a "0". A particular MTJ 500 can be written to by allowing a second current (the second current is larger than the first current) to pass through the MTJ. Passing the current through one way will write a "1" and passing the current through the other way will write a "0". The bidirectional nature of switching elements disclosed herein can provide the ability to drive current both ways through the MTJ 500.

In embodiments, the RSM cell can be a RRAM cell. FIG. 5C is a schematic diagram of an illustrative resistive random access memory (RRAM) cell 560. The RRAM cell 560 includes a medium layer 512 that responds to an electrical current or voltage pulse by altering an electrical resistance of the medium layer 512. This phenomenon can be referred to as the electrical pulse induced resistance change effect. This effect changes the resistance (i.e., data state) of the memory from one or more high resistance state(s) to a low resistance state, for example. The medium layer 512 is interposed between a first electrode 514 and the second electrode 516 and acts as a data storage material layer of the RRAM cell. The first electrode 514 and the second electrode 516 are electrically connected to a voltage source (not shown). The first electrode 514 and a second electrode 516 can be formed of any useful electrically conducting material such as, for example, a metal.

The material forming the medium layer 512 can be any known useful RRAM material. In embodiments, the material forming the medium layer 512 can include an oxide material such as, a metal oxide. In some embodiments, the metal oxide is a binary oxide material or complex metal oxide material. In other embodiments, the material forming the medium layer 512 can include a chalcogenide solid electrolyte material or an organic/polymer material.

The binary metal oxide material can be expressed as a chemical formula of $M_xO_y$. In this formula, the characters "M", "O", "x", and "y" refer to metal, oxygen, a metal composition ratio, and an oxygen composition ratio, respectively. The metal "M" may be a transition metal and/or aluminium (Al). In this case, the transition metal may be nickel (Ni), niobium (Nb), titanium (Ti), zirconium (Zr), hafnium (Hf), cobalt (Co), iron (Fe), copper (Cu) and/or chrome (Cr). Specific examples of binary metal oxides that may be used as the medium layer 512 include CuO, NiO, CoO, ZnO, $CrO_2$, $TiO_2$, $HfO_2$, $ZrO_2$, $Fe_2O_3$, and $Nb_2O_5$.

In embodiments, the metal oxide can be any useful complex metal oxide such as, for example, a complex oxide material having a formula $Pr_{0.7}Ca_{0.3}MnO_3$, or $SrTiO_3$, or $SiZrO_3$, or these oxides doped with Cr or Nb. The complex can also include $LaCuO_4$, or $Bi_2Sr_2CaCu_2O_8$. One example of a solid chalcogenide material is a germanium-selenide ($Ge_xSe_{100-x}$) containing a silver (Ag) component. One example of an organic material is Poly(3,4-ethylenedioxythiophene) (i.e., PEDOT).

The RSM cell can also include ferroelectric capacitors having structures similar to FIG. 5C using materials such as lead zirconate titanate (referred to as "PZT") or $SrBi_2Ta_2O_9$ (referred to as "SBT"). In such memory cells, an electrical current can be used to switch the polarization direction and the read current can detect whether the polarization is up or down. In such embodiments, a read operation is a destructive process, where the cell will lose the data contained therein, requiring a refresh to write data back to the cell.

Memory elements as disclosed include a switching element as disclosed above; and a non volatile memory cell. An exemplary embodiment of a memory element 600 as disclosed herein is depicted in FIG. 6A. The memory element 600 includes a switching element 615 that includes a first semiconductor layer 650, an insulating layer 640, a second semiconductor layer 630, a first metal contact 660, and a second metal contact 670 as described and exemplified above. The spatial orientation with respect to the memory cell 605 is not meant to be limited by the depiction. The orientation is generally only meant to show that the non volatile memory cell 605 is electrically connected in series to one of the metal contacts (FIG. 6A shows the non volatile memory cell 605 electrically connected to the second metal contact 670, but it could of course be the first metal contact 660).

FIG. 6B is a circuit diagram depicting the functioning of the components of the non volatile memory element. As seen there, the switching element 615 functions as two individual diodes 611 and 612 in parallel. The switching element 615 is then connected in series to the non volatile memory cell 605 that functions as a resistor. The voltage provided by the source 680 can provide a voltage greater than $V_{T1}$ (see FIG. 1C) which allows the current to go one way through the circuit or a voltage less than $V_{T2}$ (see FIG. 1C) which allows the current to go the other way through the circuit. The two paths can allow various operations to be carried out on the non volatile memory cell 605, including determining the resistance state of the non volatile memory cell 605.

Memory elements as disclosed herein can be utilized in memory arrays. In embodiments, memory elements as disclosed herein can be utilized in crossbar memory arrays. An exemplary depiction of a crossbar memory array is illustrated in FIG. 7A. An exemplary crossbar memory array includes a first layer of approximately parallel conductors 702 that are overlain (or underlain) by a second layer of approximately parallel conductors 704. In embodiments, the conductors of the second layer 704 can be substantially perpendicular, in orientation, to the conductors of the first layer 702. In embodiments, the orientation angle between the layers may be other than perpendicular. The two layers of conductors form a lattice, or crossbar, each conductor of the second layer 704 overlying all of the conductors of the first layer 702 and coming into close contact with each conductor of the first layer 702 at conductor intersections that represent the closest contact between two conductors. Although individual conductors in FIG. 7A are shown with rectangular cross sections, conductors can also have square, circular, elliptical, or any other regular or irregular cross sections. The conductors may also have many different widths or diameters and aspect ratios or eccentricities.

Memory elements as disclosed above can be disposed at at least some of the conductor intersections of the crossbar memory arrays. In embodiments, disclosed memory elements can be disposed at substantially all of the conductor intersections. A conductor intersection connected by disclosed memory elements can be referred to as a "crossbar junction." FIGS. 7B and 7C provide two different illustrations of a crossbar junction that interconnects conductors 702a and 704a of two contiguous layers within a crossbar memory array. The crossbar junction may or may not involve physical contact between the two conductors 702a and 704a. As shown in FIG. 7B, the two conductors are not in physical contact at their overlap point, but the gap between the conductors 702a and 704a is spanned by the memory element 706a that lies between the two conductors at their closest overlap point. FIG. 7C illustrates a schematic representation of the memory element 706a and overlapping conductors 702a and 704a shown in FIG. 7B.

Disclosed memory elements may be advantageously utilized in crossbar memory arrays because the switching devices that are included in the memory elements can function as an integrated selective element that can avoid or minimize disturbances on unintended cells during read, write and erase operations due to sneak currents. The switching devices disclosed herein are especially advantageous in combination with STRAM because STRAM requires writing and erasing operations to be carried out using opposite polarities.

Thus, embodiments of SCHOTTKY DIODE SWITCH AND MEMORY UNITS CONTAINING THE SAME are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A switching element comprising:
   a first semiconductor layer, the first semiconductor layer having a first portion and a second portion;
   a second semiconductor layer, the second semiconductor layer having a first portion and a second portion;
   an insulating layer disposed between the first semiconductor layer and the second semiconductor layer;
   a first metal contact in contact with the first portion of the first semiconductor layer forming a first junction and in contact with the first portion of the second semiconductor layer forming a second junction;
   a second metal contact in contact with the second portion of the first semiconductor layer forming a third junction and in contact with the second portion of the second semiconductor layer forming a fourth junction, wherein the first junction and the fourth junction are Schottky contacts, and the second junction and the third junction are ohmic contacts.

2. The switching element according to claim 1, wherein the first semiconductor layer and the second semiconductor layer are independently chosen from: silicon, silicon containing compounds, germanium, germanium containing compounds, aluminium containing compounds, boron containing compounds, gallium containing compounds, indium containing compounds, cadmium containing compounds, zinc containing compounds, lead containing compounds, and tin containing compounds.

3. The switching element according to claim 1, wherein the first semiconductor layer is crystalline silicon and the second portion is doped with phosphorus (P), boron (B), or arsenic (As).

4. The switching element according to claim 1, wherein the second semiconductor layer is crystalline silicon and the first portion is doped with phosphorus (P), boron (B), or arsenic (As).

5. The switching element according to claim 1, wherein the second portion of the first semiconductor layer and the first portion of the second semiconductor layer are heavily doped with phosphorus (P), boron (B), or arsenic (As).

6. The switching element according to claim 5, wherein the first portion of the first semiconductor layer and the second portion of the second semiconductor layer are not heavily doped.

7. The switching element according to claim 1 further comprising a second insulating layer and a substrate layer wherein the second insulating layer is located between the substrate layer and the first semiconductor layer and the second insulating layer is in contact with the first and second metal contacts.

8. A non volatile memory element comprising:
a switching device comprising:
a first semiconductor layer, the first semiconductor layer having a first portion and a second portion;
a second semiconductor layer, the second semiconductor layer having a first portion and a second portion;
an insulating layer disposed between the first semiconductor layer and the second semiconductor layer;
a first metal contact in contact with the first portion of the first semiconductor layer forming a first junction and in contact with the first portion of the second semiconductor layer forming a second junction;
a second metal contact in contact with the second portion of the first semiconductor layer forming a third junction and in contact with the second portion of the second semiconductor layer forming a fourth junction,
wherein the second junction and the third junction are ohmic contacts; and
a non volatile memory cell,
wherein the switching device is electrically connected in series with the non volatile memory cell.

9. The non volatile memory element according to claim 8, wherein the first junction and the fourth junction are Schottky contacts.

10. The non volatile memory element according to claim 8, wherein the second portion of the first semiconductor layer and the first portion of the second semiconductor layer are doped with phosphorus (P), boron (B), or arsenic (As).

11. The non volatile memory element according to claim 8, wherein the first portion of the first semiconductor layer and the second portion of the second semiconductor layer are not doped.

12. The non volatile memory element according to claim 8, wherein the first and second semiconductor layers have substantially the same thicknesses.

13. The non volatile memory element according to claim 8 wherein the non volatile memory cell is a spin torque transfer random access memory (STRAM) stack.

* * * * *